US010450225B2

United States Patent
Moon et al.

(10) Patent No.: US 10,450,225 B2
(45) Date of Patent: Oct. 22, 2019

(54) LOW REFLECTIVE AND SUPERHYDROPHOBIC OR SUPER WATER-REPELLENT GLASSES AND METHOD OF FABRICATING THE SAME

(71) Applicant: KOREA INSTITUTE OF SCIENCE AND TECHNOLOGY, Seoul (KR)

(72) Inventors: Myoung Woon Moon, Seoul (KR); Heon Ju Lee, Seoul (KR); Jeong Sim Lee, Seoul (KR); Tae Jun Ko, Seoul (KR); Kyu Hwan Oh, Seoul (KR); Do Hyun Kim, Seoul (KR); Eu Sun Yu, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 171 days.

(21) Appl. No.: 15/109,839

(22) PCT Filed: Dec. 2, 2014

(86) PCT No.: PCT/KR2014/011729
§ 371 (c)(1),
(2) Date: Jul. 6, 2016

(87) PCT Pub. No.: WO2015/102240
PCT Pub. Date: Jul. 9, 2015

(65) Prior Publication Data
US 2016/0326048 A1 Nov. 10, 2016

(30) Foreign Application Priority Data
Jan. 6, 2014 (KR) ........................ 10-2014-0001424

(51) Int. Cl.
*C03C 17/42* (2006.01)
*B81C 1/00* (2006.01)
*C03C 15/00* (2006.01)

(52) U.S. Cl.
CPC .......... *C03C 17/42* (2013.01); *B81C 1/00031* (2013.01); *B81C 1/00111* (2013.01);
(Continued)

(58) Field of Classification Search
CPC ............. B81C 1/00111; B81C 1/00031; B81C 2201/0132; H01L 21/32137; C03C 17/42
(Continued)

(56) References Cited

U.S. PATENT DOCUMENTS 5,789,040 A * 8/1998 Martinu ................ C23C 16/517
427/255.5
2010/0248993 A1* 9/2010 Tserepi ................ B01J 19/0046
506/30
(Continued)

FOREIGN PATENT DOCUMENTS

KR 10-2011-0106099 A 9/2011
KR 10-2013-0014135 A 2/2013
(Continued)

OTHER PUBLICATIONS

International Search Report issued in counterpart International Application No. PCT/KR2014/011729 dated Mar. 17, 2015 (2 pages in English).

*Primary Examiner* — Binh X Tran
(74) *Attorney, Agent, or Firm* — NSIP Law

(57) ABSTRACT

The present invention relates to a glass having a surface with improved water-repellency or hydrophobicity and low reflectance, and a fabrication method thereof. A technology is employed, in which a thin film containing silicon or silicon oxide is formed on the glass surface, the nano-structures are formed by selective etching treatment using a reactive gas such as $CF_4$ or the like to provide superhydrophobicity and low reflectance properties, and a material with low surface energy is coated onto the nano-structures. The fabrication method of the low-reflective and superhydrophobic or super water-repellent glass may execute deposition and etching processes for the glass having the superhydrophobicity and the low reflectance, and provide excellent superhydrophobicity and low reflectance to the surface of the glass which was difficult to be treated. Also, the method is sustainable due to non-use of a toxic etching solution during these processes. The superhydrophobic and low-reflective glass can be applied to various fields, such as high-tech smart devices, vehicles, home appliances and so forth.

16 Claims, 10 Drawing Sheets

(52) U.S. Cl.
CPC ...... *C03C 15/00* (2013.01); *B81C 2201/0132* (2013.01); *C03C 2217/76* (2013.01); *C03C 2218/153* (2013.01); *C03C 2218/328* (2013.01); *C03C 2218/33* (2013.01)

(58) Field of Classification Search
USPC ........................................ 216/11, 39, 79, 80
See application file for complete search history.

(56) References Cited

U.S. PATENT DOCUMENTS

| | | | |
|---|---|---|---|
| 2011/0053800 A1* | 3/2011 | Jung | C12N 5/0068 506/14 |
| 2011/0189858 A1* | 8/2011 | Yasseri | H01L 21/02057 438/694 |
| 2012/0181346 A1* | 7/2012 | Greer | C03C 15/00 239/1 |
| 2012/0276334 A1* | 11/2012 | Fedynyshyn | B05D 5/04 428/141 |
| 2012/0288681 A1* | 11/2012 | Sondergard | C03C 14/004 428/156 |
| 2013/0323466 A1* | 12/2013 | Baca | B08B 17/065 428/141 |
| 2014/0011013 A1* | 1/2014 | Jin | B05D 5/08 428/297.4 |

FOREIGN PATENT DOCUMENTS

| | | |
|---|---|---|
| KR | 10-2013-0055954 A | 5/2013 |
| WO | WO 2013/162174 A1 | 10/2013 |

* cited by examiner

[Fig. 1]
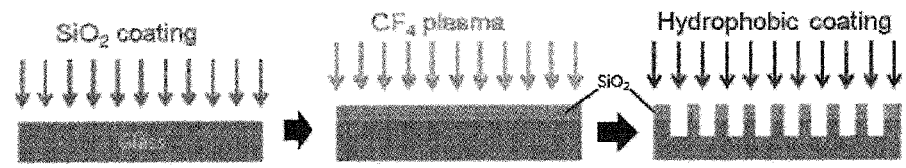
[Fig. 2a]
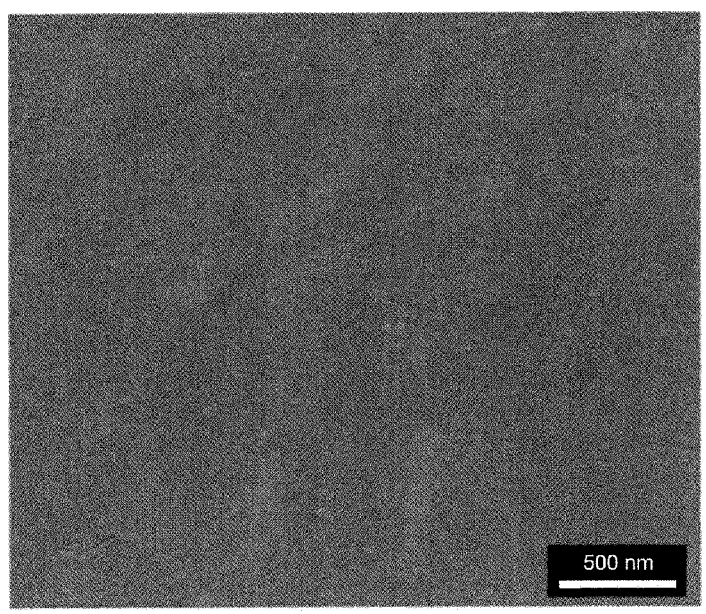
[Fig. 2b]
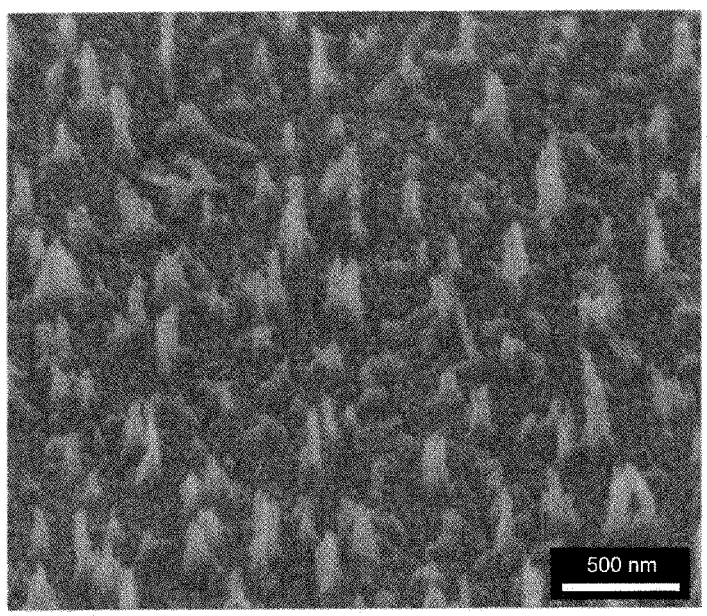

[Fig. 2c]
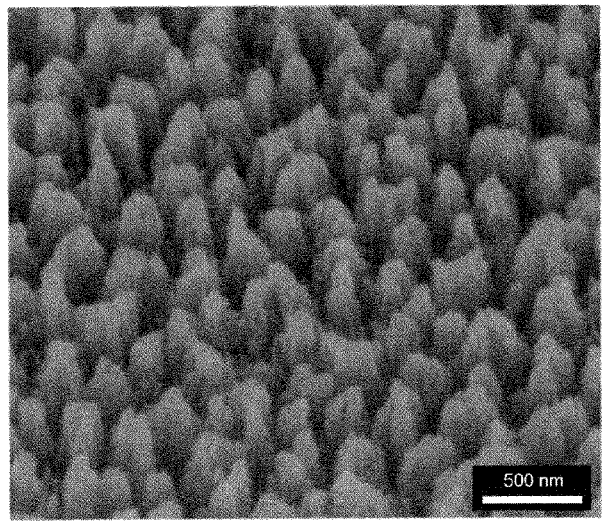
[Fig. 2d]
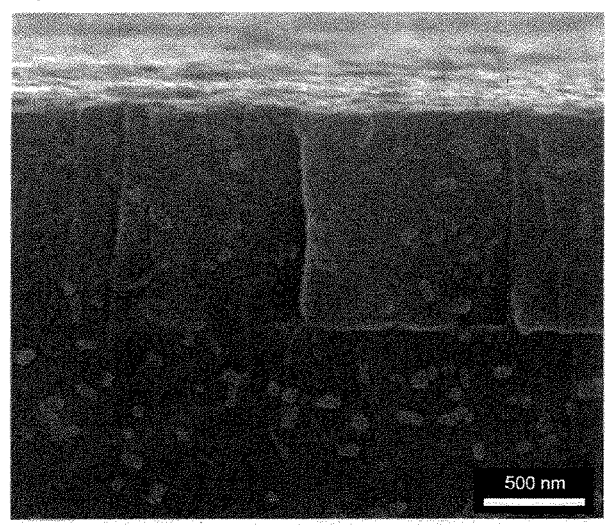
[Fig. 2e]
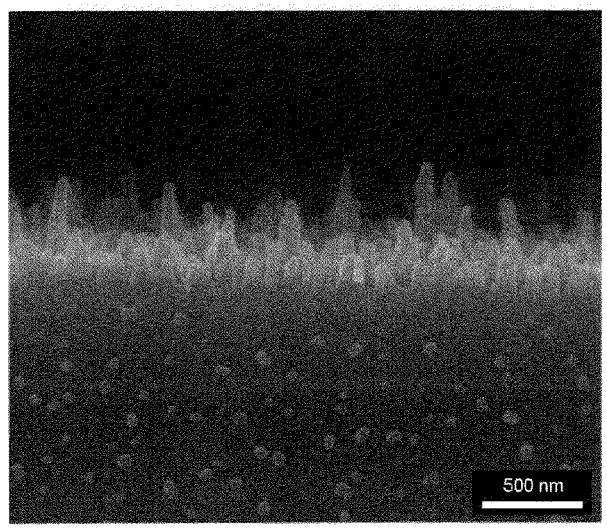

[Fig. 2f]
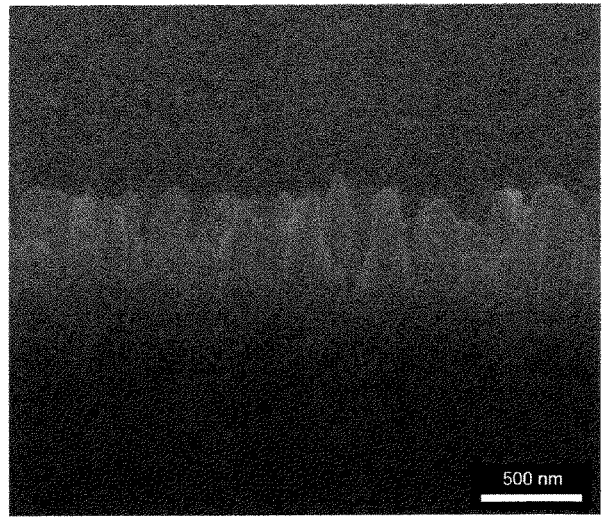
[Fig. 3a]
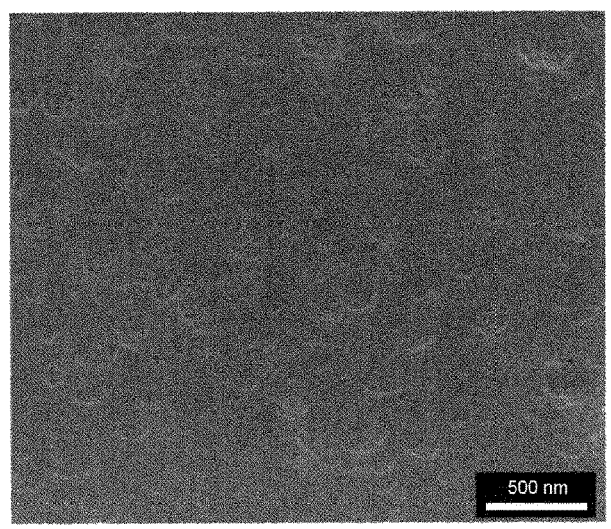
[Fig. 3b]
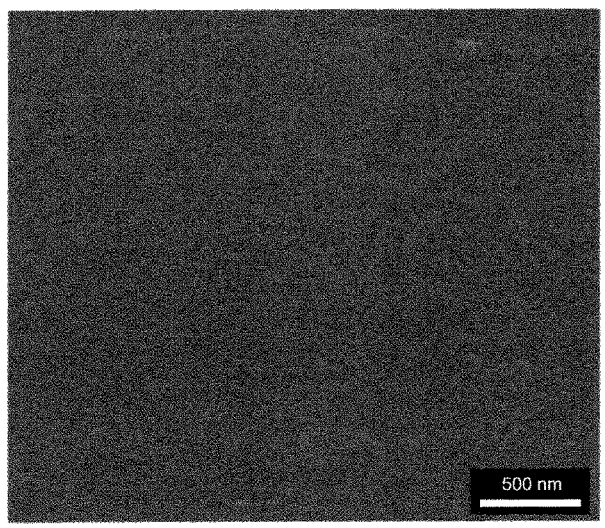

[Fig. 3c]
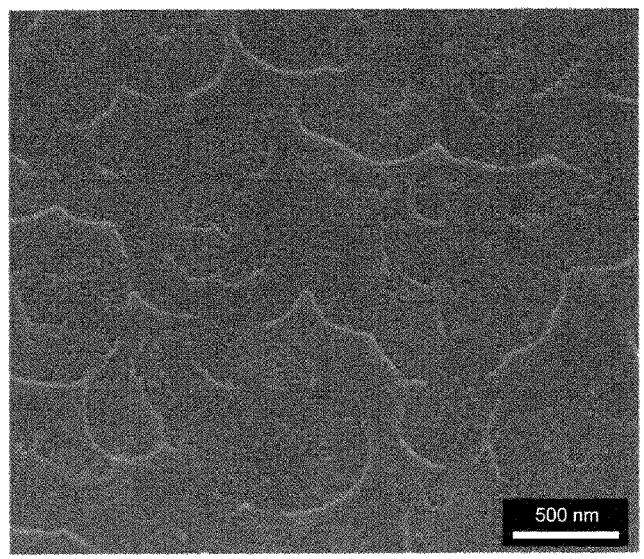
[Fig. 4a]
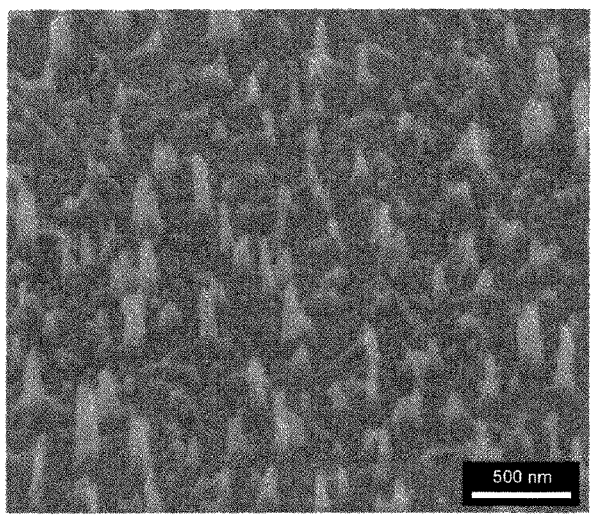
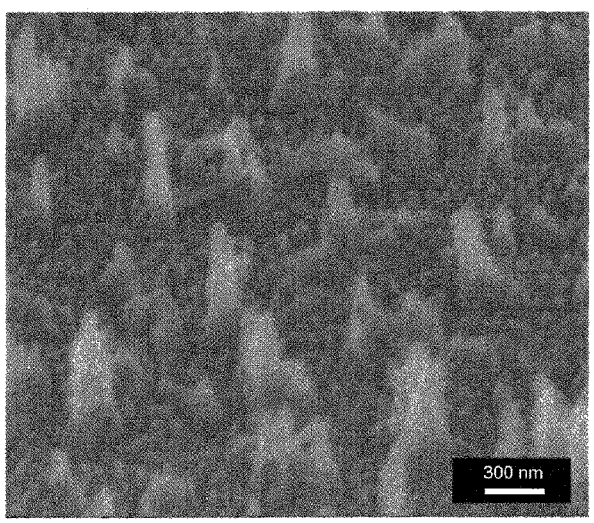

[Fig. 4b]
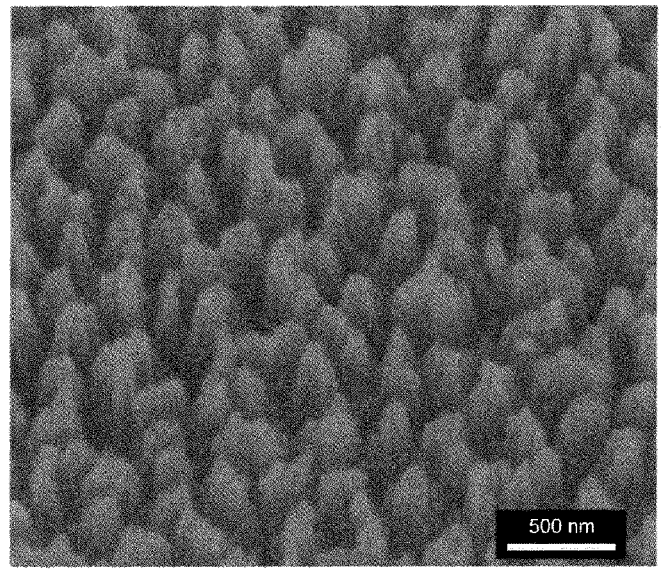
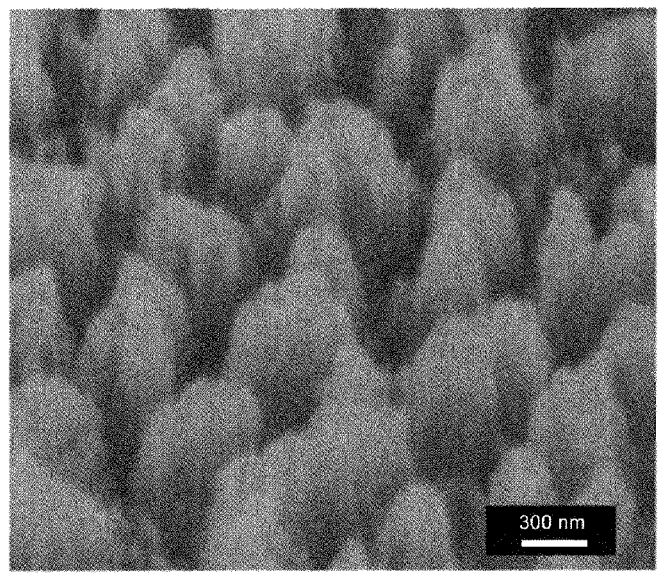

[Fig. 4c]
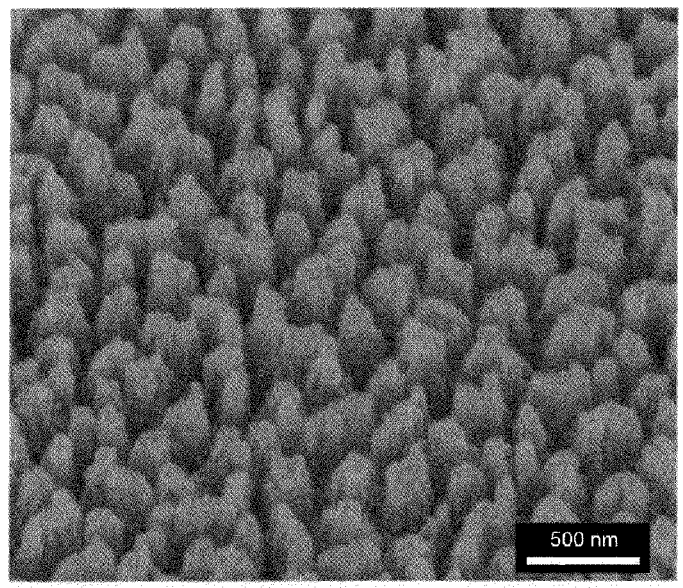
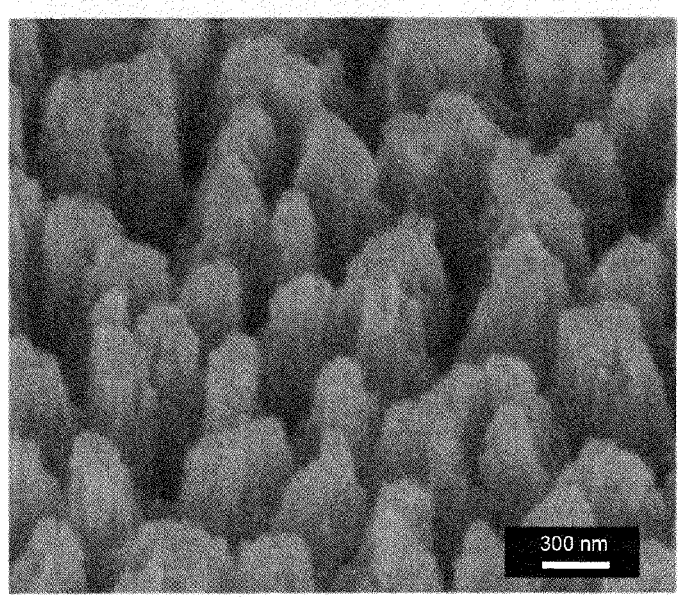
[Fig. 5a]
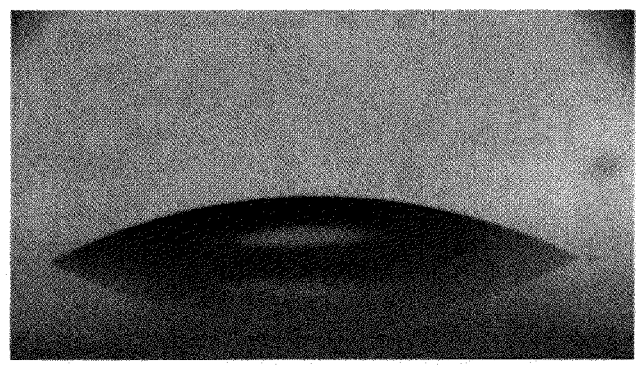

[Fig. 5b]
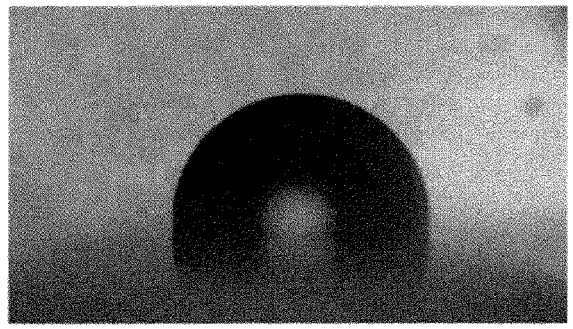
[Fig. 5c]
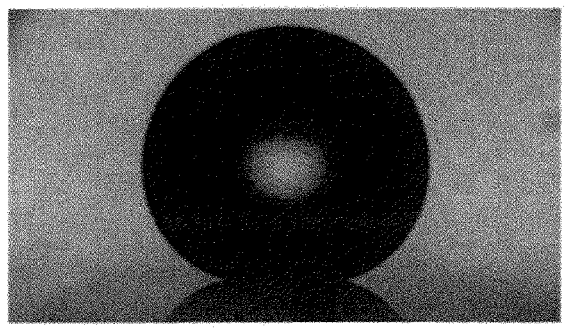
[Fig. 6a]
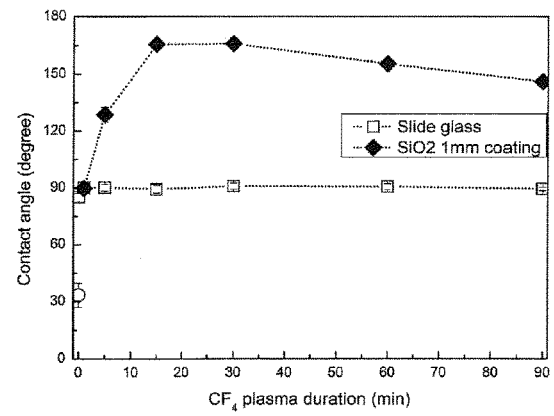
[Fig. 6b]
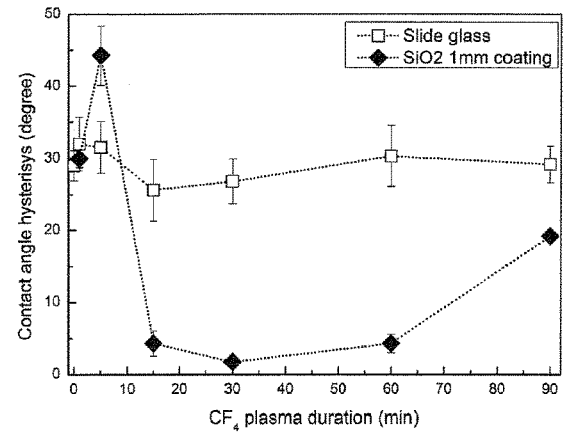

[Fig. 7a]
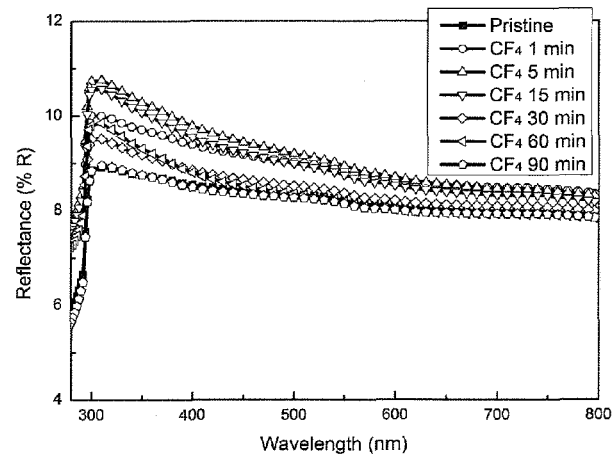
[Fig. 7b]
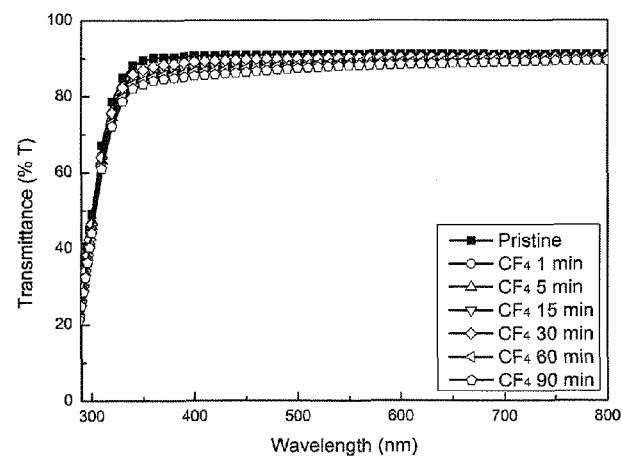
[Fig. 8a]
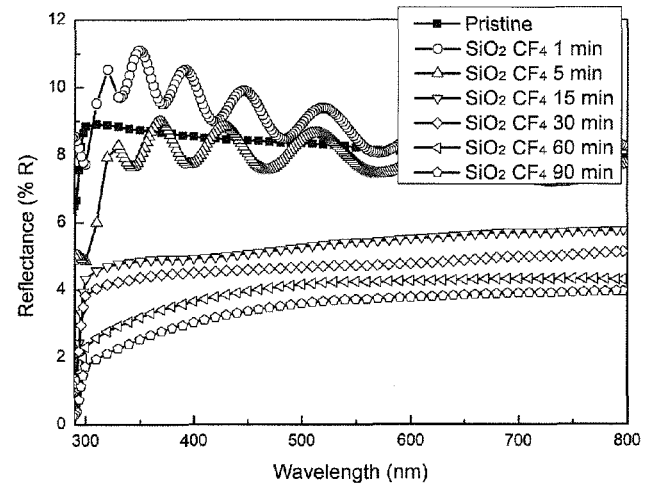

[Fig. 8b]
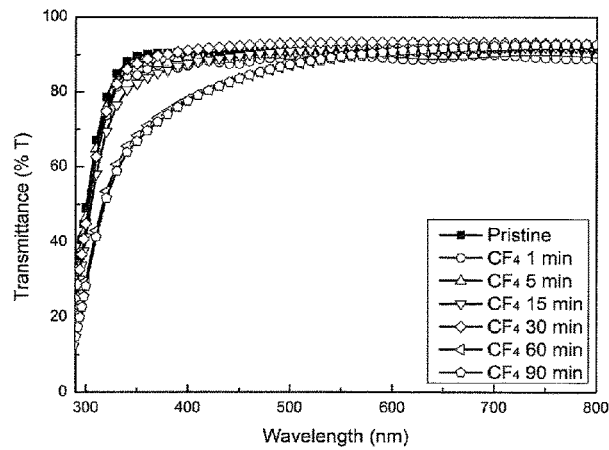
[Fig. 9a]
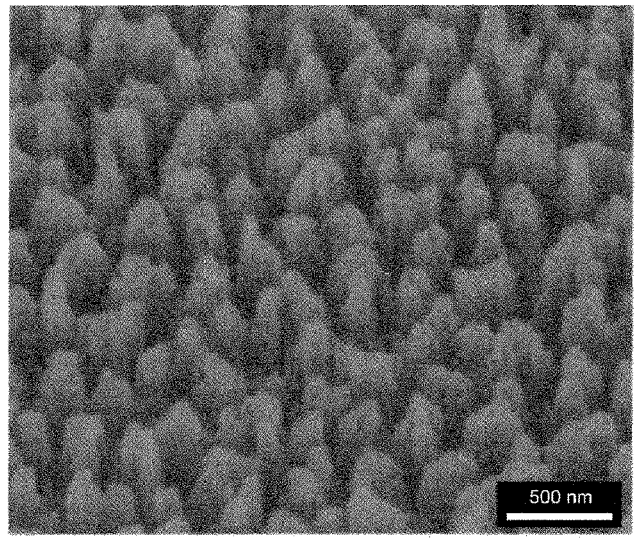
[Fig. 9b]
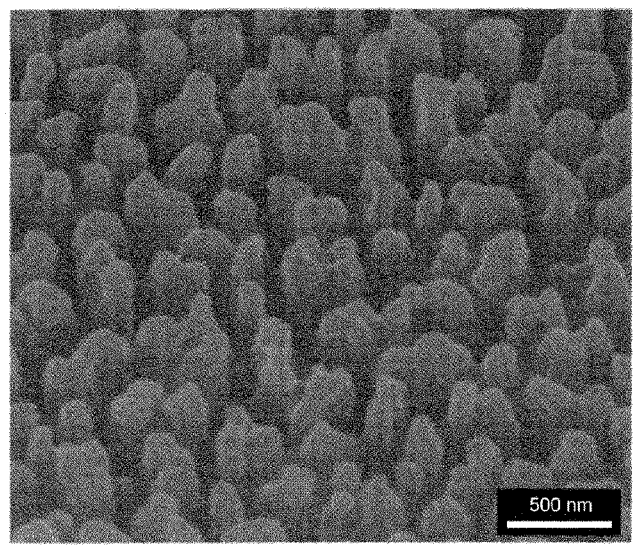

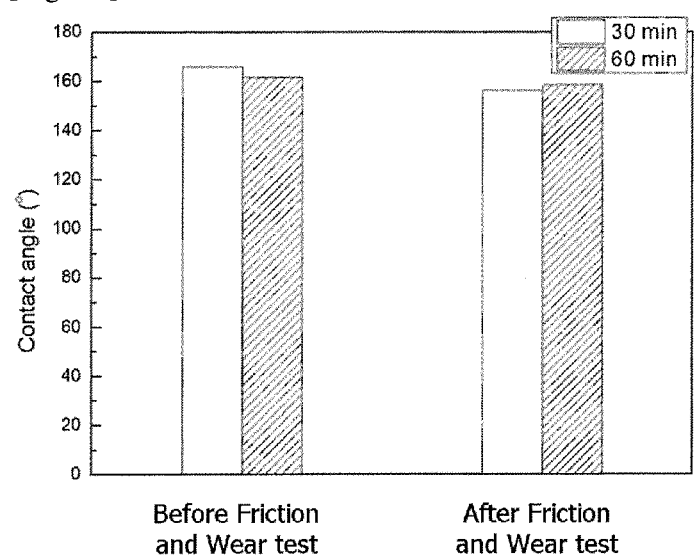
[Fig. 10]

LOW REFLECTIVE AND SUPERHYDROPHOBIC OR SUPER WATER-REPELLENT GLASSES AND METHOD OF FABRICATING THE SAME

CROSS-REFERENCE TO RELATED APPLICATIONS

This application is a U.S. National Stage Application of International Application No. PCT/KR2014/011729, filed on Dec. 2, 2014, which claims the benefit under 35 USC 119(a) and 365(b) of Korean Patent Application No. 10-2014-0001424, filed on Jan. 6, 2014, in the Korean Intellectual Property Office.

TECHNICAL FIELD

The present invention relates to a low-reflective and superhydrophobic or super water-repellent glass and a method of fabricating the same, and specifically, to a glass having characteristics of high abrasion resistance, continuous low reflectance and superhydrophobicity or super water-repellency, which is fabricated by forming nano-protrusions on the surface of the glass and performing a hydrophobic coating on the surface thereof, so as to significantly reduce reflectance and maximize hydrophobicity or water-repellency, and a method of fabricating the same.

BACKGROUND ART

Glass which has low light reflectance and is transparent has been widely utilized in diverse fields such as various displays including smart devices, mirrors or glasses for vehicles, inner or outer glasses of buildings or home appliances, and the like. There have been attempted a number of researches to provide on the surface of a glass various functionalities such as fingerprint resistance or hydrophobicity plausibly sliding water droplets on the surface, and the like.

In order to grant hydrophobicity or water-repellency or reduce light reflectance on the surface of a glass, a method for forming a new surface structure has been attempted, in which the surface of the glass is etched or coated. However, since the glass is made of various materials, it tends not to be easy to etch the glass merely by applying general etching conditions. An attempt has been made to etch the glass surface using a toxic solution such as hydrofluoric acid (HF), but regardless of utilizing a technology using such toxic material it has been found that a particular nano-sized pattern is not formed on the glass surface in a feasible manner.

To fabricate a glass surface with high hydrophobicity and low reflectance, representatively applicable techniques include a method of uniformly dispersing particles on a glass surface to serve as a mask and executing plasma etching thereon, a method of forming a nano-structure by adhering particles on a glass surface via spraying, and so forth.

The etching process executed after coating the mask on the glass surface has advantages not only in excellent durability in that the nano-structure is directly formed on the glass surface per se, but in controllability of the nanopillar size by means of modulating etching conditions. However, since it is not easy to uniformly disperse the particles on the glass surface and is cumbersome to remove particle remnants after the etching, entire process steps are increased, and a process is necessary to utilize the toxic material for removing the particles remaining on the surface [Joonsik Park, Hyuneui Lim, Wandoo Kim, Jong Soo Ko, Journal of Colloid and Interface Science, 360, 272 (2011)].

As another process, there is a method of forming a structure by spraying particles with a particular size. The process is carried out in a manner of spraying and adhering particles of a material, such as $TiO_2$ or $SiO_2$, on glass using a chemical method or a sol-gel method to structuralize the glass surface using a nano-structure derived from the shape of the particle per se.

These methods have been known to be advantageous in that an etching process is not involved in a fabrication process because the particles are well-dispersed to form the structures on the glass surface, but to have a problem that adhesion between the particles and the glass surface is not easy.

That is, in the surface structure formed by the aforementioned method, the particles are apt to be readily separated from the glass surface in response to an external impact where the adhesive force between the particles and the glass surface is insufficient. In addition, the surface structure represents a drawback that cracks are easily generated between the particles [Taoye Wang, Tayirjan T Isimjan, Jianfeng Chen, Sohrab Rohani, Nanotechnology, 22, 265708 (2011)].

DISCLOSURE OF INVENTION

Technical Problem

The object of this invention is to provide a low-reflective and superhydrophobic or super water-repellent glass in which hydrophobicity or water-repellency is conferred and reflectance is remarkably reduced by forming a nano-structure and a hydrophobic coating layer on the surface of the glass. Another object of this invention is to provide a method for fabricating a low-reflective and superhydrophobic or super-water-repellent glass, which could not only execute the fabrication process in a simple and economical manner without utilizing a detrimental etching solution, but also feasibly modulate properties of final products. The low-reflective and superhydrophobic or super water-repellent glass may be applied to a variety of fields including conventional types of glass as well as high-tech smart devices, surfaces or glasses of automobiles, home appliances, and the like.

Solution to Problem

To achieve these and other advantages and in accordance with the purpose of the present invention, as embodied and broadly described herein, there is provided a method for fabricating a low-reflective and superhydrophobic or super water-repellent glass, comprising a first step of preparing a thin film-deposited glass, wherein the thin film comprises any one selected from the group consisting of silicon, silicon oxide and a combination thereof, and is deposited on an entire or partial surface of the glass; a second step of fabricating an etched glass, wherein the surface of the thin film-deposited glass is selectively etched to have needle-like or pillar-like nano-protrusions on the entire or partial surface thereof; and a third step of preparing a low-reflective and superhydrophobic or super water-repellent glass by forming a hydrophobic coating layer on the surface of the etched glass with the nano-protrusions.

The nano-protrusions may include needle-like or pillar-like nano-protrusions with a height of 10 nm to 500 nm, and have a high aspect ratio of 1 to 20.

The thin film in the first step may be formed by at least one process selected from a group consisting of sputtering, plasma enhanced chemical vapor deposition (PECVD), e-beam evaporation, and thermal evaporation, and may be formed with a thickness of 100 nm to 1000 nm.

The etching in the second step may be carried out by at least one method selected from a group consisting of plasma etching, reactive ion etching, ion-milling, and electro discharge machining (EDM).

The selective etching in the second step may be a plasma etching treatment using a reactive gas, and the reactive gas may include any one selected from a group consisting of $CF_4$, $CHF_3$, $C_2F_6$, $C_2Cl_2F_4$, $C_3F_8$, $C_4F_8$, $SF_6$ and a combination thereof.

The plasma etching may be performed under a condition that a plasma acceleration voltage is in the range of −100 Vb to −1000 Vb and a plasma etching pressure is in the range of 1 Pa to 10 Pa. The plasma etching treatment may be carried out during a treatment time of 10 sec to 90 min.

The hydrophobic coating layer formed in the third step may have a thickness of 1 nm to 100 nm.

The hydrophobic coating layer in the third step may be a hydrocarbon-based hydrophobic thin film containing silicon and oxygen, or a hydrocarbon-based hydrophobic thin film containing fluorine.

The hydrophobic coating layer in the third step may be deposited using a plasma enhanced chemical vapor deposition (PECVD), wherein the plasma enhanced chemical vapor deposition is performed under a condition that a precursor gas containing 0 to 30 percent by volume (vol %) of argon gas and 70 vol % to 100 vol % of hexamethyldisiloxane (HMDSO) gas is utilized, and each R.F power supply and bias voltage is set in a range of 10 W to 200 W and −100 V to −1000 V.

A low-reflective superhydrophobic or super water-repellent glass in accordance with another exemplary embodiment disclosed herein may include an etched glass having needle-like or pillar-like nano-protrusions formed on the surface of the glass; and a hydrophobic coating layer on the surface thereof; wherein the nano-protrusions may include any one selected from a group consisting of silicon, silicon oxide and a combination thereof, and wherein the etched glass may include the nano-protrusions at a density of $1\times10^6$ to $1\times10^7$ per unit area (1 mm2), which have a size in a range of 10 nm to 20 nm.

The nano-protrusions may have a high aspect ratio of 1 to 20.

The low-reflective and superhydrophobic or super water-repellent glass may have a reflectance of 7% or less, a water contact angle of 150° or more, and a contact angle hysteresis of 10° or less.

The term "superhydrophobic or super-water-repellent condition" used herein, refers to satisfy a condition of both a great water contact angle and a low contact angle hysteresis, and specifically, in a case having this condition, the term means any condition, on which contaminants may not be readily adhered on the surface of a glass, and even if adhered, they may be easily detached such that the surface may be kept uncontaminated for a long-term period even without a special washing process. For example, the superhydrophobic or super water-repellent condition may be set to meet that a contact angle is greater than or equal to 150°, and a contact angle hysteresis of water is smaller than or equal to 10°.

As used herein, the term "needle-like" or "pillar" is to express a shape of nano-protrusions. The needle-like protrusion designates a shape of a nano-protrusion in which a diameter of the nano-protrusion adjacent to the surface of a glass is greater than that farthest away from the surface of the glass, and the diameter of the nano-protrusion is gradually decreased in a direction from a portion adjacent to the surface of the glass toward a farther portion from the surface of the glass. The pillar-like protrusion indicates a shape of a nano-protrusion that the protrusion has a very slight difference in a diameter of between a portion contacting the surface and the farthest portion from the surface. However, where it is difficult to discriminate these terms in respect of expressing the structure of the nano-protrusions, the terms "needle-like" and "pillar-like" may be interchangeably used.

The term "comprise" or "have" used herein should be construed to include any one or all of a feature, a number, a step, a component or a combination thereof disclosed herein, and should not be intended to exclude the possibility of the presence or addition of one or more other features, numbers, steps, elements or combinations thereof. The term "have" and the like will be used as the same meaning as the term "comprise" and the like, and vice versa.

The detailed description aims at providing a glass having superhydrophobicity or super water-repellence and low reflectance, and a preparation method thereof. Hereinafter, more detailed description will be given.

A method for fabricating a low-reflective and superhydrophobic or super water-repellent glass in accordance with one exemplary embodiment disclosed herein includes a first step of preparing a thin film-deposited glass, wherein the thin film comprises any one selected from the group consisting of silicon, silicon oxide and a combination thereof, and is deposited on an entire or partial surface of the glass; a second step of fabricating an etched glass, wherein the surface of the thin film-deposited glass is selectively etched to have needle-like or pillar-like nano-protrusions on the entire or partial surface thereof; and a third step of preparing a low-reflective and superhydrophobic or super water-repellent glass by forming a hydrophobic coating layer on the surface of the etched glass with the nano-protrusions.

The formation of the thin film in the first step may be carried out by a method, for example, including sputtering, PECVD, e-beam evaporation, thermal evaporation, and so forth.

The deposition process upon forming the thin film may be preferable to apply PECVD. In this case, the deposition may include a process of transforming into a plasma phase a mixed gas which is prepared by mixing various kinds of silicon/nitrogen compounds in a volume ratio of 5.5 to 48.8 to deposit on the surface of the glass. When the silicone and nitrogen compound are mixed at the volume ratio for application, a uniform thin film may be obtained in a cheap and easy manner.

For example, the silicon compound may be any one selected from a group consisting of SiH4, HMDSO and a combination thereof, and the nitrogen compound may be any one selected from a group consisting of N2O, NO and a combination thereof, for example.

The thin film formation using the silicone compound or the like in the first step may also be considered as a pre-treatment step for the selective etching of the second step. In such a manner where the thin film of the silicon compound or the like is formed in the first step, the etching of the second step may be performed in a more selective manner. As a result, the aspect ratio of the nano-protrusions may be enhanced, but the thin film deposition in the first step is not limited to the above meaning.

The etching process in the second step may be carried out, for example by applying plasma etching, reactive ion etching, ion-milling, or electro discharge machining (EDM) or the like, and by simultaneously applying one or more of those methods.

Preferably, the selective etching process in the second step may be a plasma etching treatment using a reactive gas, and the reactive gas may include, for example, $CF_4$, $CHF_3$, $C_2F_6$, $C_2Cl_2F_4$, $C_3F_8$, $C_4F_8$, $SF_6$ and so on, or a combination of the aforementioned gases. Preferably, $CF_4$ may be applied as the reactive gas.

The selective etching process, for example, may be carried out by employing a plasma etching treatment, or an ion-beam etching using a reactive gas.

A principle which allows for the selective etching process using plasma etching should be construed to result from metallic ions generated from a metal contained in a chamber or an anode used at the plasma treatment. When plasma particles of the reactive gas transformed into the plasma phase sputter a wall of the chamber or the metal as the anode material, metallic ions of chrome, iron, nickel or the like may be redeposited on the thin film; the metallic ions may locally be flocculated on the thin film to form a cluster; consequently, the surface of the thin film may represent a partially different etching speed in a manner that the etching speed is slow on a portion with the cluster and fast on a portion without the cluster. Therefore, the surface of the thin film may be formed with different etching depths caused from the difference of the etching speed, leading to formation of the nano-protrusions [Sung-Chul Cha, Eun Kyu Her, Tae-Jun Ko, Seong Jin Kim, Hyunchul Roh, Kwang-Ryeol Lee, Kyu Hwan Oh, Myoung-Woon Moon, Journal of Colloid and Interface Science, 391, 152 (2013)].

In the selective etching process, the reactive gas is preferably $CF_4$, and the silicon compound is preferably $SiO_2$. The use of them may facilitate a fabrication of the etched glass having the needle-like or pillar-like nano-protrusions in a regular form on the surface of the deposited glass.

The plasma etching treatment for the selective etching process may be carried out, for example, by modulating conditions such as plasma treatment time, acceleration voltage, and etching pressure.

The plasma acceleration voltage may be set in a range of −100 Vb to −1000 Vb, and the etching pressure may be set in a range of 1 Pa to 10 Pa. When the acceleration voltage is in the range of −100 Vb to 1000 Vb, an acceleration speed of the plasma particles of the reactive gas may be suitably controllable, resulting in smooth etching treatment and formation of nano-protrusions with a desired shape. Additionally, the etching pressure may be in the range of 1 Pa to 10 Pa. When etching process is carried out in such etching pressure range, the nano-protrusions with low reflectance may be formed.

The treatment time for executing the plasma etching treatment may be in a range of 10 sec to 90 min, 15 min to 70 min, or 15 min to 60 min.

When the etching treatment time is less than 10 sec, the nano-protrusions may be poorly formed to make it difficult to fabricate the etched glass with hydrophobicity. On the other hand, when the etching treatment time exceeds 90 min, the nano-protrusions per se may be still much etched to cause the reduction in a length thereof. Subsequently, even if forming the hydrophobic coating layer, it may be difficult to ensure sufficient superhydrophobicity or super water-repellency.

When the etching treatment time is longer than or equal to 5 min, the nano-protrusions may exist in an irregular manner. When equal to or longer than 15 min, a nano-structure in which the nano-protrusions with different lengths are co-existent may be formed to acquire sufficient superhydrophobicity or super water-repellency. In addition, when the etching treatment time is equal to or longer than 30 min, long nano-protrusions with a considerable height of 400 nm or more may coexist with small nano-protrusions with a height of not more than 200 nm or 100 nm. Accordingly, when forming the hydrophobic coating layer later, much higher hydrophobicity or water-repellency may be shown. However, if the etching treatment time exceeds 70 min, the contact angle hysteresis may be apt to gradually increase. Therefore, upon the etching treatment time for longer than 70 min, superhydrophobicity obtained by the nano-structure may be slightly lower than that obtainable upon etching treatment time of shorter than or equal to 70 min.

Meanwhile, the low reflectance upon etching treatment for more than about 15 min may be definitely higher than that for shorter than 15 min. Optical transmittance may overall exhibit excellent results irrespective of the etching time. Upon etching treatment for more than 60 min, the optical transmittance trends to be slightly lowered near ultraviolet and visible light in a wavelength range below 800 nm.

Therefore, in order to obtain a glass having superhydrophobicity or super water-repellency as well as low reflectance with maintaining optical transmittance, the etching treatment may be preferably carried out during 15 min to 50 min. In order to obtain a glass which exhibits hydrophobicity or water-repellency and low reflectance along with low optical transmittance for ultraviolet and visible light, the etching treatment may be carried out preferably for 60 min to 90 min. Further, in order for a glass to have low optical transmittance for ultraviolet and visible light and represent superhydrophobicity or super water-repellency and low reflectance, the etching may be preferably carried out for 60 min to 70 min.

As described above, the nano-structure can be created on the deposited glass (i.e., the thin film-deposited glass containing silicon, silicon oxide or the like) by adjusting the etching conditions through the selective etching treatment caused from the interaction between the silicon oxide and the reactive gas.

The thin film containing the silicon oxide or the like may be in a thickness of 100 nm to 1000 nm. When the thickness of the thin film is within such range, the nano-protrusions may be sufficiently formed, and the glass itself may not be etched or insignificantly etched, which may result in minimizing the changes of characteristics of the glass per se and granting superhydrophobicity or super water-repellency and low reflectance thereto.

The nano-protrusions formed by the selective etching treatment may have an aspect ratio of 1 to 20. The nano-protrusions may include needle-like or pillar-like nano-protrusions each of which has a height of 10 nm to 500 nm. Within the range, the nano-protrusions may be uniform in size, or the nano-protrusions with various sizes may coexist.

When the nano-protrusions of various sizes are coexistent and subsequently the hydrophobic coating layer is formed, the superhydrophobicity or super water-repellency can be expressed more effectively. That is, the needle-like or pillar-like nano-protrusions may be controlled in size and shape by adjusting the etching conditions, and in this connection, the hydrophobicity or water-repellency can be modulated. Here, the height of the nano-protrusions refers to a length from the lowermost portion of the protrusion, which is a position of an engraved portion of the thin film or the glass due to the etching, to the highest portion of the protrusion.

The etching treatment of this invention has been illustrated using the plasma etching. Besides, the etching process such as ion-milling, electro discharge machining, reactive ion etching or the like may be applied to form the nanostructure having the nano-protrusions.

The hydrophobic coating layer in the third step may be implemented by any material with low surface energy, where it is capable of forming a thin film on the nanostructure, but is not limited to. For example, a hydrocarbon-based thin film containing silicon and oxygen or a hydrocarbon-based thin film containing fluorine may be applied as the hydrophobic coating layer, and the coating layer containing hexamethylenedisiloxane (HMDSO), molybdenum disulfide (MoS2) or boron nitride (BN), or the like may be utilized in the hydrophobic coating layer.

The deposition treatment for forming the hydrophobic coating layer may also be achieved by applying diverse chemical vapor depositions, atomic layer deposition, or the like, and preferably, plasma-enhanced chemical vapor deposition (PECVD).

When the hydrophobic coating layer is treated by PECVD, preferably a precursor gas containing mixed gas of argon and HMDSO, or HMDSO gas may be used. The hydrophobic coating layer may be in a thickness of 1 nm to 100 nm. When the thickness is thinner than 1 nm, the hydrophobicity desired to obtain by the hydrophobic coating may not be fully exhibited. When the thickness exceeds 100 nm, the aspect ratio of the nano-protrusions may be decreased by the coating layer, which may be concerned to lower hydrophobic property.

The deposition utilized for forming the hydrophobic coating layer may be performed using PECVD, for example. When carrying out PECVD, R.F power supply may be set in the range of 10 W to 200 W, and a bias voltage may be set in the range of −100 V to −1000 V.

The precursor gas used in PECVD may be mixed gas containing inert argon gas and reactive HMDSO gas. Here, 1 to 30 vol % of the inert gas may be contained in the mixed gas. When the inert gas contained in the mixed gas exceeds 30 vol %, the hydrophobicity of the surface may be lowered.

FIG. 1 is a schematic diagram of fabricating a low-reflective and superhydrophobic glass in accordance with one exemplary embodiment disclosed herein. As referring to FIG. 1, the low-reflective and superhydrophobic or super water-repellent glass may be prepared by forming a thin film containing silicon dioxide on a glass surface (the first step, left panel), etching the glass surface using $CF_4$ plasma to form nano-protrusions on the surface (the second step, middle panel), and forming a hydrophobic coating layer (the third step, right panel).

The low-reflective and superhydrophobic or super water-repellent glass in accordance with still another exemplary embodiment disclosed herein may include an etched glass having needle-like or pillar-like nano-protrusions on the surface of the glass, and a hydrophobic coating layer located on the surface of the etched glass. The nano-protrusions may contain any one selected from a group consisting of silicon, silicon oxide and a combination thereof. The etched glass may involve the nano-protrusions at a density of $1 \times 10^6$ to $1 \times 10^7$ per unit area (1 mm2), which have a size in a range of 10 nm to 500 nm.

Since the size and aspect ratio of the nano-protrusion, the hydrophobic coating layer and the thin film containing silicon, silicon oxide or the like were described above, the detailed description thereof will be omitted in order to avoid undue redundancy.

The low-reflective superhydrophobic or super water-repellent glass may have a reflectance of 7% or less, and preferably, 5% or less. That is to say, considering that the conventional glass (soda lime glass) has a reflectance of 8% to 10%, it may be noticed that the low-reflective superhydrophobic or super water-repellent glass of the present invention has more reduced reflectance. In this regard, as aforementioned, the glass representing a low reflectance property may be provided by gradually reducing the reflectance, starting from 8-10% sequentially down to 5%, 4% or the like, in a manner of changing the etching treatment conditions.

Also, the low-reflective and superhydrophobic or super water-repellent glass may have a water contact angle of 150° or more, and a contact angle hysteresis of 10° or less. The water contact angle refers to an angle formed between an inner surface of a droplet of pure water and a solid surface when the droplet comes in contact with the solid. When the value is greater, it indicates that the surface of the solid coming in contact with the droplet of the water has higher hydrophobicity or water repellency against the water. When the water contact angle is greater than or equal to 150°, it is generally said that the glass has superhydrophobicity or super water-repellency. Furthermore, the low-reflective and superhydrophobic or super water-repellent glass has the contact angle hysteresis smaller than or equal to 10°, such that contaminants cannot be easily adhered on the surface of the glass or can be easily detached.

Advantageous Effects of Invention

The low-reflective and superhydrophobic or super water-repellent glass of the present invention can have superhydrophobicity or super water repellency and low reflectance by virtue of reducing reflectance and optimizing hydrophobicity on the glass surface. Also, a method for fabricating a low-reflective and superhydrophobic or super water-repellent glass may be allowed to easily control the superhydrophobicity and low reflectance of the glass even if applying a relatively simple process, permitting to provide cost reduction as well as sustainable preparation method without using a harmful etching solution.

The low-reflective superhydrophobic or super water-repellent glass may be applicable to a wide range of areas such as glasses for smart devices, surface glass of vehicles or the exterior of a building, low-reflective glasses as a substrate cover of a solar cell, optical devices, and so forth.

BRIEF DESCRIPTION OF DRAWINGS

FIG. 1 is a conceptual view representing a fabrication process of a low-reflective superhydrophobic or super water-repellent glass in accordance with one exemplary embodiment disclosed herein.

FIGS. 2a to 2b are images obtained by observing the surface-treated glass surfaces using a scanning electron microscopy (SEM) in accordance with examples of the present disclosure and comparative examples. FIGS. 2a and 2d are front and sectional SEM images of a glass surface deposited with $SiO_2$ thin film (Comparative Example 4), respectively; FIGS. 2b and 2e are front and sectional SEM images of a glass surface (Example 1-3) plasma-etched for 15 min, respectively; and FIGS. 2c and 2f are front and sectional SEM images of a glass surface (Example 1-5) plasma-etched for 60 min, respectively.

FIGS. 3a to 3c are SEM images on microstructures of glass surfaces, which are formed by treating the general glass surfaces with CF$_4$ plasma, in accordance with comparative examples disclosed herein. Each treatment time is 1 min, 15 min and 60 min (i.e., Comparative Examples 1-1, 1-3 and 1-5, respectively), and each images thereof are illustrated in FIGS. 3a to 3c.

FIGS. 4a to 4c are SEM images with low (upper panel) and high (lower panel) magnification of observing microstructures of glass surfaces formed by treating with CF$_4$ plasma the SiO$_2$ thin film-coated glass surface in accordance with examples disclosed herein. Each treatment time is 30 min, 60 min and 90 min (i.e., Examples 1-4, 1-5 and 1-6, respectively), and each images thereof are shown in FIGS. 4a to 4c.

FIGS. 5a to 5c are optical microscopic images for evaluating a property in a water contact angle of the glass prepared according to an Example and a Comparative Example disclosed herein. FIG. 5a is the optical microscopic image of a water droplet on the glass surface (Comparative Example 1); FIG. 5b is the optical microscopic image of a water droplet on the glass surface, which is obtained by carrying out only hydrophobic coating after merely executing CF$_4$ treatment without coating a SiO$_2$ thin film on the glass (Comparative Example 2-5); and FIG. 5c is the optical microscopic image of a water droplet on the superhydrophobic or super water-repellent glass surface (Example 1-5).

FIGS. 6a and 6b are graphs showing the changes of contact angle and contact angle hysteresis according to various plasma treatment times. FIG. 6a is a graph of the changes of the water contact angle and FIG. 6b is a graph of the changes of the contact angle hysteresis, depending on the CF$_4$ plasma treatment time after executing the nano-structure formation and the hydrophobic coating.

FIGS. 7a and 7b are results evaluating low reflectance and optical transmittance of Comparative Examples disclosed herein, and specifically, graphs illustrating the changes of the reflectance and optical transmittance according to a treatment time after carrying out only CF$_4$ plasma treatment without coating the SiO$_2$ thin film on the glass (Soda lime glass) (i.e., by lapse of time, Comparative Examples 2-1 to 2-6), together with the results of Comparative Examples 1 and 4. FIG. 7a and FIG. 7b illustrate the reflectance and transmittance, respectively.

FIGS. 8a and 8b represent evaluation results of low reflectance and optical transmittance of Examples 1-1 to 1-6 disclosed herein, and in more detail, graphs illustrating measurements of reflectance and transmittance of samples having the hydrophobic coating layer formed after carrying out CF$_4$ plasma treatment on the SiO$_2$ thin film-deposited glass (soda lime glass), together with Comparative Example 1 and a sample obtained merely by carrying out the SiO$_2$ coating on the glass (Comparative Example 3). FIG. 8a shows the reflectance and FIG. 8b represent the transmittance.

FIGS. 9a and 9b are SEM images before and after executing a Friction and Wear test using a sample fabricated by Example 1-5. FIG. 9a is an image before Friction and Wear test for a glass surface having superhydrophobicity or super water-repellency, and FIG. 9b is an image after Friction and Wear test executed by a force of 5N.

FIG. 10 is a graph illustrating measurements of contact angles on the superhydrophobic or super water-repellent glass surfaces before and after Friction and Wear test using samples prepared by Examples 1-4 and 1-5 disclosed herein.

BEST MODE FOR CARRYING OUT THE INVENTION

Hereinafter, embodiments of the present invention will be described below in detail with reference to the accompanying drawings to be feasibly practiced by those skilled in the art the present disclosure belongs to. However, the present disclosure can be implemented into various alternatives, and may be not limited to the following Examples to be explained herein.

1. Fabrication of the Low-Reflective and Superhydrophobic or Super Water-Repellent Glass Fabrication of the Low-Reflective and Superhydrophobic or Super Water-Repellent Glass of Examples 1-1 to 1-6

In accordance with Examples 1-1 to 1-6 hereinafter, this description will be given of a process of fabricating a glass having a surface exhibiting superhydrophobicity or super water-repellency and low reflectance, in a manner of forming nano-protrusions on a glass surface deposited with a SiO$_2$ thin film, which contains any one selected from a group consisting of silicon, silicon oxide and a combination thereof, and carrying out a hydrophobic coating for the glass surface.

A SiO$_2$ thin film was deposited in a thickness of 1000 nm on a general glass (soda lime glass). The SiO$_2$ thin film deposition was carried out through a plasma-enhanced chemical vapor deposition (PECVD) process, in a manner of mixing SiH$_4$ with N$_2$O gas in a volume ratio of 1:50, transforming the mixed gas into a plasma phase, and depositing the plasma gas onto the glass.

A CF$_4$ plasma treatment was carried out on the glass (deposited glass) having the SiO$_2$ thin film thereon to form microstructures. The CF$_4$ plasma treatment was performed by adjusting a treatment time under a condition that a bias voltage was −600 V and a deposition pressure was 30 mtorr. The CF$_4$ plasma treatment for the deposited glass was executed by adjusting the treatment time to 1 min, 5 min, 15 min, 30 min, 60 min or 90 min, thereby preparing corresponding etched glasses which then served as etched glass samples of Examples 1-1 to 1-6, respectively.

The etched glass samples of Examples 1-1 to 1-6 were coated with a hydrophobic thin film, respectively. The coating of the hydrophobic thin film was carried out through PECVD using hexamethyldisiloxane (HMDSO) gas for 15 sec under a condition of 10 mtorr and −400 V.

Subsequently, characteristics of the low-reflective and superhydrophobic or super water-repellent glass of each of Examples 1-1 to 1-6 having the hydrophobic coating layer and all were evaluated.

Comparative Example 1

Characteristic evaluation was carried out for a sample as a glass of Comparative Example 1, which was obtained without SiO$_2$ thin film deposition or CF$_4$ plasma treatment with respect to the glass which was the same as the general glass (soda lime glass) used in Example 1.

Fabrication of the Glass of Comparative Examples 2-1 to 2-6

Each glass of Comparative Examples 2-1 to 2-6 was produced by CF$_4$ plasma treatment without a SiO$_2$ thin film deposition on the glass which was the same as the general glass (soda lime glass) used in Example 1. The CF$_4$ plasma treatment was the same as that carried out in each of Examples 1-1 to 1-6. The etched glass of each of Comparative Examples 2-1 to 2-6, which was the glass whose surface was etched by the CF$_4$ plasma treatment, was coated with a hydrophobic thin film, equally as done in Examples 1-1 to 1-6, thereby fabricating samples of Comparative Examples 2-1 to 2-6.

To correspond to Examples 1-1 to 1-6 described above, the glass of each of Comparative Examples 2-1 to 2-6 also was fabricated by diversely modulating the plasma treatment time, and served as the samples of Comparative Examples 2-1 to 2-6 (i.e., treated for each treatment time of 1 min, 5 min, 15 min, 30 min, 60 min and 90 min). Thus, characteristics of the obtained samples were evaluated.

Fabrication of the Glass of Comparative Examples 3 and 4

Only a $SiO_2$ thin film was coated on the general glass (soda lime glass), which was the same as that of Example 1, without an additional plasma treatment or a formation of a hydrophobic coating layer. The resulting glass was utilized as a sample of Comparative Example 3.

Also, the same hydrophobic coating layer (HMDSO) as those of Examples 1-1 to 1-6 was formed on the general glass (soda lime glass), without the $SiO_2$ thin film deposition or the $CF_4$ plasma treatment. As a result, the obtained glass served as a sample of Comparative Example 4.

2. Evaluation on Superhydrophobicity/Super-Water Repellency of the Low-Reflective and Superhydrophobic or Super Water-Repellent Glass Hereinafter, measurement of a contact angle was executed using a Goniometer (Data Physics instrument Gmbh, OCA 20L). This instrument allowed for measurement of an optical image and a contact angle with respect to a sessile droplet on a surface of glass. The contact angle hysteresis was measured based on a difference between an advancing contact angle and a receding contact angle.

Water Contact Angle Measurement of Comparative Examples 1 and 2-5, and Example 1-5

A contact angle for pure water on the surface of the sample of Comparative Example 1, which was a pure glass without any treatment, was measured as shown in FIG. 5a. With reference to the image of FIG. 5a, it was verified that the contact angle of the glass surface was maintained at about 20°.

FIG. 5b shows a measurement result of a water contact angle of the sample (Comparative Example 2-5), which was obtained by merely carrying out the $CF_4$ plasma treatment on the glass surface for 60 min, without deposition of the $SiO_2$ thin film, and then coating the hydrophobic thin film on the surface of the glass. Referring to the image of FIG. 5b, the water contact angle of the glass surface measured in Comparative Example 2-5 was about 90°. The water contact angle value of Comparative Example 2-5 was similar to that of Comparative Example 2-4, which was the sample prepared by coating only the hydrophobic thin film on the surface of the glass without etching treatment for forming microstructures on the surface.

FIG. 5c is an image showing a measurement of a contact angle on the surface of the glass sample of Example 1-5, which was obtained by carrying out the $SiO_2$ thin film deposition, the $CF_4$ plasma treatment for 60 min, and the hydrophobic thin film coating in a sequential manner. It was noticed from the image that the surface of the glass sample of Example 1-5 exhibited superhydrophobicity or super water-repellency in view of the measured great contact angle of about 160°.

Measurement of the Water Contact Angle Changes According to Etching Treatment Time With respect to pure water, contact angles and contact angle hysteresis of the low-reflective and superhydrophobic or super-water-repellent glass samples, which were fabricated by adjusting the etching treatment time in Examples 1-1 to 1-6, were illustrated in forms of graphs in FIGS. 6a and 6b, in association with each etching treatment time.

Referring to the graph of FIG. 6a, the water contact angle was increased up to 120°, starting from when the $CF_4$ plasma etching was carried out for 5 min, and then increased up to about 160° from when the plasma etching duration is 15 min. Then, the water contact angle was maintained over about 160° until the plasma etching time was 30 min. Simply, it might be noticed that the contact angle was slightly decreased from after the plasma treatment time exceeds 60 min, in other words, the water contact angle of about 150° was observed. However, it might be confirmed that the glass sample still had a considerably high water contact angle value which could be classified as superhydrophobicity or super water-repellency. When the plasma treatment was carried out for 90 min, the water contact angle of about 145° was measured, suggesting that the superhydrophobicity or super water-repellency of the glass surface was slightly lowered.

Referring to the graph of FIG. 6b, similarly, the contact angle hysteresis as the difference between the advancing contact angle and the receding contact angle was remarkably increased when the etching treatment was carried out for 5 min, but a low contact angle hysteresis below 5° was observed from after 15 min, at which the superhydrophobicity or super water-repellency started to be found. The contact angle hysteresis at 90 min increased again, and the samples etched for 15 min to about 70 min exhibited superhydrophobicity, for which the contact angle hysteresis of the samples was smaller than or equal to about 10°. When the etching was carried out for about 90 min, it may be checked the contact angle hysteresis was increased up to about 20°, but still lower than that of the glass surface etched for shorter than or equal to 5 min or without etched.

3. Evaluation on Low Reflectance and Optical Transmittance of the Low-Reflective and Superhydrophobic or Super Water-Repellent Glass Low reflectance and optical transmittance were evaluated using those samples of Comparative Examples and Examples prepared in Item 1.

FIGS. 7a and 7b are graphs showing measurement results of reflectance (FIG. 7a) and transmittance (FIG. 7b) of Comparative Examples 2-1 to 2-6 depending on the etching treatment time, which were obtained by treating the glass (soda lime glass) by $CF_4$ plasma without depositing the $SiO_2$ thin film thereon, and then coating the plasma-treated glass with the hydrophobic thin film, and also showed the measurement results of Comparative Example 1 (an untreated glass) and Comparative Example 4 (a glass forming only the hydrophobic thin film without the $SiO_2$ thin film deposition and $CF_4$ plasma etching).

Referring to the results shown in FIGS. 7a and 7b, when the $CF_4$ plasma treatment directly was carried out on the general glass (soda lime glass) without deposition of the $SiO_2$ thin film, it might be demonstrated that an optical property of the glass surface was not greatly different from the general glass surface prior to the treatment. This can be understood as resulting from an inconsiderable change in the structure of the glass surface.

FIGS. 8a and 8b are graphs showing evaluation results of reflectance and transmittance of Examples 1-1 to 1-6 disclosed herein, and specifically, graphs showing measured reflectance and transmittance, of each of the samples obtained by performing the $CF_4$ plasma treatment for the $SiO_2$ thin film-deposited glass (soda lime glass) and then coating the hydrophobic thin film on the surface thereof, the general glass sample in Comparative Example 1, and the sample in Comparative Example 3 as obtained by depositing only the $SiO_2$ thin film on the general glass. Each graph of FIG. 8a and FIG. 8b represent the reflectance and the transmittance.

Referring to the graph of the reflectance measurement results of FIG. 8a, when the plasma etching is carried out after depositing the $SiO_2$ thin film on the glass surface, the nano-structures may be created. Hence, it can be noticed that an optical property is also changed in a remarkable manner. After 15 min of etching, the change of reflectance in an ultraviolet region may start to be observed. This may result from the formation of nano-pillars with a height of 200 nm or more. The conventional glass (Comparative Example 1) represents 8-9% of reflectance values. Starting from the Example 1-3 in which the etching was carried out for 15 min, 5% of reflectance was measured. A value lower than or equal to 5% of reflectance was measured in Example 1-4 etched for 30 min, and a value lower than or equal to 4% of reflectance was measured in Examples 1-5 and 1-6, which were the samples etched for 60 min and 90 min, respectively.

Referring to the graph of the transmittance measurement results of FIG. 8b, the samples of Examples 1-1 to 1-4, in which the nano-protrusions were formed on the glass surface, did not have a great difference from the general glass as the sample of Comparative Example 1 in view of the transmittance. However, it was confirmed that the samples of Examples 1-5 and 1-6 exhibited low transmittance in a wavelength range near ultraviolet-visible light, to which each 60 min-etching and 90 min-etching duration were applied. This may be determined as resulting from the glass itself being etched.

That is, the samples having the nano-protrusions on the glass due to etching of the thin film do not have a great difference from the existing glass prior to the etching treatment. However, it can be understood, in association with the samples of Examples 1-5 and 1-6, that reduction of both reflectance and transmittance results from a structural cause that the glass itself has been etched.

The plasma-treated glass without formation of the $SiO_2$ thin film, as similar to the samples of Comparative Examples 2-1 to 2-6, did not show visibly significant change in reflectance, and exhibited a contact angle of about 90°, which was as great as HMDSO coating layer, namely, the hydrophobic thin film. However, when the nano-protrusions were formed after the $SiO_2$ thin film deposition as shown in Examples, low reflectance was actually observed and simultaneously the water contact angle was about 160°. Therefore, it was confirmed that a glass surface having superhydrophobicity or super water-repellency could be fabricated.

4. Evaluation on the Microstructure of the Low-Reflective and Superhydrophobic or Super Water-Repellent Glass To observe the microstructures of the samples of Examples and Comparative Examples, front and sectional microstructures thereof were observed using an SEM.

FIGS. 2a to 2f illustrate front and sectional SEM images of the samples of Comparative Example 4 and Examples 1-3 and 1-5. Referring to the sample image of Comparative Example 4 having the $SiO_2$ film on the glass of FIGS. 2a and 2d, a clear boundary can be observed between the glass and the $SiO_2$ thin film. Referring to the sample images of Example 1-3 plasma-etched for 15 min in FIGS. 2a and 2d, the formation of the nano-needle or nano-pillar structures can be observed. Referring to the sample image of Example 1-5 plasma-etched for 60 min, as illustrated in FIGS. 2c and 2f, the pillar structure can be obviously observed. However, since the glass is etched by more than 1 μm which is the thickness of the $SiO_2$ thin film, the patterns with a width of about 500 nm can be observed in the glass per se.

The surface of the glass having the predetermined patterns, as similar to the above nano-pillar structure, actually exhibited reduced reflectance and increased superhydrophobicity or super water-repellency when viewed with naked eyes.

FIGS. 3a to 3c are SEM images showing the formation of the microstructures on the general glass surface upon carrying out the $CF_4$ plasma etching treatment to the general glass surface in accordance with Comparative Example disclosed herein. Each etching time was 1 min, 15 min and 60 min (Comparative examples 1-1, 1-3 and 1-5, respectively), and those images were shown in FIGS. 3a, 3b and 3c, respectively.

Referring to FIGS. 3a to 3c, upon non-deposition of the $SiO_2$ thin film on the glass, the nano-protrusions with a high aspect ratio are not developed, and a change such as generating a little surface roughness is produced on the glass surface. That is, the nano-protrusions may not be formed by the $CF_4$ plasma treatment, and a great structural change of the surface may not be shown. Also, even if the hydrophobic thin film was coated on the surfaces of the samples of Comparative Examples, about 90° of the water contact angle was constantly measured from the surfaces. It was also confirmed that the surfaces had predetermined contact angles, irrespective of the change of the etching treatment time.

FIGS. 4a to 4c are SEM images with low (upper panel) and high (lower panel) magnification of the $SiO_2$ thin film-coated glass surface, treated by the $CF_4$ plasma etching for 30 min (FIG. 4a, Example 1-4), 60 min (FIG. 4b, Example 1-5), and 90 min (FIG. 4c, Example 1-6), in accordance with Examples disclosed herein. It was identified that a density of the pillar or a depth between the pillars was varied according to the change of the etching duration.

That is, the surface pattern of the low-reflective and superhydrophobic glass was controllable depending on the etching treatment time. When the etching duration was set to be 1 min, the needle-like or pillar-like nano-protrusions were not clearly formed, and it was observed as a time point that the nano-protrusions which were about 1 nm in length started to be formed.

When the etching was carried out for about 5 min, the nano-protrusions of about 5 nm were irregularly distributed. When etched for 15 min, both nano-protrusions of 200 nm and small nano-protrusions of about 100 nm were coexistent. From when etched for about 15 min, the clear superhydrophobicity of the glass surface started to be visible.

As shown in FIGS. 4a to 4c, when the plasma etching was carried out for 30 min, the great nano-protrusions has a height of about 400 nm, and the small nano-protrusions are several nanometers high due to the $SiO_2$ thin film being etched to a lower portion thereof. The coexistence of the great structure and the small structure may allow for acquiring much more enhanced hydrophobicity or water-repellency.

Starting from the 60-minute treatment, all of the existing $SiO_2$ thin film are etched out and even the lower glass itself may be etched, such that the nano-protrusions has a thicker and longer shape. The length of the nano-protrusions is about 500 nm. After the treatment for 90 min, it was confirmed that the length of the protrusion was rather shortened because an upper portion of the glass may be etched.

5. Evaluation on Durability of the Low-Reflective and Superhydrophobic or Super Water-Repellent Glass FIGS. 9a and 9b illustrate results of a Friction and Wear test using the sample fabricated by Example 1-5 disclosed herein, namely, images before (FIG. 9a) and after (FIG. 9b) of the Friction and Wear test by applying a force of 5N onto the glass surface having the superhydrophobicity. As shown in FIGS. 9a and 9b, it was confirmed that the shapes of the nano-protrusions before and after the Friction and Wear test represented a structural change that an end portion of the protrusion partially became flat, but a great change in the surface structure was not found in the aspect that the nano-protrusions were overall formed.

FIG. 10 is a graph measuring contact angles on the superhydrophobic or super water-repellent glass surface before and after the Friction and Wear test using the samples prepared by Examples 1-4 and 1-5 disclosed herein. For the sample etched for 30 min, the contact angle was 165° and then slightly decreased to 156° after a durability test, but still maintained the superhydrophobicity or super water-repellency. For the sample etched for 60 min, since the structure was formed directly on the glass per se, less decrease of the contact angle from 161° down to 158° was observed, from which the fabrication of the superhydrophobic or super water-repellent glass with high durability could be confirmed.

The preferred embodiments of the present disclosure have been described in detail so far, but the claims of the present disclosure may not be limited to those embodiments, but many alternatives and improvements made by those skilled in the art using the basic conception of the present disclosure, defined in the following claims, are belonging to the scope of the present disclosure.

The invention claimed is:

1. A method for fabricating a low-reflective and superhydrophobic or super water-repellent glass with a predetermined reflectance, water contact angle, and contact angle hysteresis, the method comprising:
    a first step of preparing a thin film-deposited glass, wherein the thin film has a predetermined thickness, and comprises any one selected from the group consisting of silicon, silicon oxide and a combination thereof, and is deposited on an entire or partial surface of the glass;
    a second step of fabricating an etched glass, wherein the surface of the thin film-deposited glass is selectively etched to have needle-like or pillar-like nano-protrusions with a predetermined height on the entire or partial surface thereof; and
    a third step of preparing the low-reflective and superhydrophobic or super water-repellent glass by forming a hydrophobic coating layer on the surface of the etched glass with the nano-protrusions,
    wherein the surface of the thin film-deposited glass is selectively etched by a plasma etching treatment using a reactive gas for a treatment time of 30 minutes to 90 minutes, and
    wherein the first step comprises preparing a mixed gas of a silicon compound and a nitrogen compound and transforming the mixed gas into a plasma phase.

2. The method of claim 1, wherein the nano-protrusions comprises needle-like or pillar-like nano-protrusions with a height of 10 nm to 500 nm.

3. The method of claim 1, wherein the nano-protrusions have a high aspect ratio of 1 to 20.

4. The method of claim 1, wherein the thin film in the first step is formed by at least one process selected from the group consisting of sputtering, plasma enhanced chemical vapor deposition (PECVD), e-beam evaporation, and thermal evaporation.

5. The method of claim 1, wherein the thin film in the first step is formed with a thickness of 100 nm to 1000 nm.

6. The method of claim 1, wherein the etching process in the second step is carried out by at least one method selected from the group consisting of plasma etching, reactive ion etching, ion-milling, and electro discharge machining (EDM).

7. The method of claim 1, wherein the reactive gas comprises any one selected from the group consisting of $CF_4$, $CHF_3$, $C_2F_6$, $C_2Cl_2F_4$, $C_3F_8$, $C_4F_8$, $SF_6$ and a combination thereof.

8. The method of claim 1, wherein the plasma etching treatment is performed under a condition that a plasma acceleration voltage is in a range of −100 V to −1000 V and a plasma etching pressure is in a range of 1 Pa to 10 Pa.

9. The method of claim 1, wherein the hydrophobic coating layer formed in the third step has a thickness of 1 nm to 100 nm.

10. The method of claim 1, wherein the hydrophobic coating layer in the third step is a hydrocarbon-based hydrophobic thin film with a predetermined thickness comprising silicon and oxygen, or a hydrocarbon-based hydrophobic thin film comprising fluorine.

11. The method of claim 1, wherein the hydrophobic coating layer in the third step is deposited using a plasma enhanced chemical vapor deposition (PECVD).

12. The method of claim 11, wherein the plasma enhanced chemical vapor deposition is performed under a condition that a precursor gas comprising 0 to 30 percentage by volume (vol %) of argon gas and 70 vol % to 100 vol % of hexamethyldisiloxane (HMDSO) gas is utilized, and each R.F power supply and bias voltage is set in a range of 10 W to 200 W and −100 V to −1000 V.

13. The method of claim 1, wherein a volume ratio of the silicon compound/the nitrogen compound is 5.5 to 48.8.

14. The method of claim 1, wherein the silicon compound is at least one selected from the group consisting of $SiH_4$ and HMDSO.

15. The method of claim 1, wherein the nitrogen compound is at least one selected from the group consisting of $N_2O$ and NO.

16. The method of claim 1, wherein the surface of the thin film-deposited glass is selectively etched by a plasma etching treatment using a reactive gas for a treatment time of 60 minutes to 90 minutes.

* * * * *